United States Patent [19]

Stribel

[11] Patent Number: 4,715,822
[45] Date of Patent: Dec. 29, 1987

[54] ELECTRICAL CONNECTION DEVICE FOR A MOTOR VEHICLE

[75] Inventor: Hans P. Stribel, Nürtingen, Fed. Rep. of Germany

[73] Assignee: Stribel GmbH, Frickenhausen, Fed. Rep. of Germany

[21] Appl. No.: 885,167

[22] Filed: Jul. 14, 1986

[51] Int. Cl.$^4$ .............................................. H01R 9/09
[52] U.S. Cl. ........................................ 439/74; 361/412
[58] Field of Search ............ 339/17 LM, 17 M, 17 N, 339/17 R; 361/393–396, 399, 412

[56] References Cited

U.S. PATENT DOCUMENTS

| 2,907,926 | 10/1959 | Slack | 339/17 N |
| 2,995,686 | 8/1961 | Selvin | 339/17 N |
| 3,072,874 | 1/1963 | Roney | 361/412 |
| 3,935,372 | 1/1976 | Triplett et al. | 339/18 C |
| 4,513,064 | 8/1985 | Marcus | 339/17 N |

FOREIGN PATENT DOCUMENTS

| 8034130 | 12/1980 | Fed. Rep. of Germany ... 339/17 M |
| 1289102 | 2/1962 | France .................................. 361/412 |

Primary Examiner—Neil Abrams
Attorney, Agent, or Firm—Michael J. Striker

[57] ABSTRACT

A central unit for interconnecting consumer circuits in a motor vehicle includes a pack of superposed insulating boards each supporting flat conductors. The conductors on the uppermost board are connected to a plurality of connector sockets for receiving connector plugs of the electric components. The flat conductors on respective insulating boards are electrically connected to flat connector pins projecting laterally from opposite sides of the pack. Two bridging connector plates are arranged parallel to the opposite sides of the pack and support bridging conductors for contacting different connector pins at different levels of the pack so as to provide a desired interconnection of the connector sockets.

16 Claims, 2 Drawing Figures

ELECTRICAL CONNECTION DEVICE FOR A MOTOR VEHICLE

BACKGROUND OF THE INVENTION

The present invention relates to a device for centralized interconnection of electric components of a motor vehicle, such as safety fuses, plug-in connectors, wiring harnesses, electronic control devices for electric consuming circuits, switching apparatuses and the like. The connection device is of the type which includes a pack of circuit plates arranged one above the other, each circuit plate including flat conductors and a supporting insulating board for separating conductors at different levels in the pack, a plurality of connector sockets electrically connected to assigned conductors at different levels of the pack to receive corresponding plugs of the electric components.

Known connection devices of this kind (the so-called central electric units) include a pack of circuit boards consisting of flat conductors stamped out from a conductive plate and being separated at different levels of the pack by intermediate insulating plates. The central electric unit performs essentially a distributing function, namely to supply power to different electrical consuming circuits of a motor vehicle, such as for example, lamps, windshield wipers, blinkers and the like and connects the same via strands of conductors or wiring harnesses with a source of electric power. Another function of the central electric unit is to monitor the operativeness of the consuming circuits and to detect and indicate any malfunction. The actuation of respective electrical consuming circuits is effected by means of switching apparatuses arranged on the upper side of the central electric unit. The central electric unit also supports safety fuses for the consumer circuits. The safety fuses are exchangeable and are provided with connector pins which are insertable in corresponding connector sockets on the upper side of the unit; the connector sockets are electrically connected to assigned flat conductors of respective conductor plates in the pack.

The bottom side of the central electric unit is provided with connectors for wiring harnesses of the motor vehicle. The upper side of the unit is also provided with connector sockets for switching apparatuses which usually include an electronic control circuit for actuating a corresponding electric consumer circuit. The switching apparatus usually includes a relay designed such as to perform the desired switching sequence for turning on or off a particular consumer circuit. Since different kinds of electric consumer circuits require different electronic controls, each individual switching apparatus includes a different control circuit. Consequently, the switching apparatuses are relatively expensive inasmuch as apart from the differentiated control circuit they include also additional protective circuits against negative pulses which may occur in the network of the motor vehicle during voltage surges and the like. Accordingly, if a switching apparatus must be replaced due to a defect in a relay, for example, the corresponding electronic controlling and protecting circuits must be discarded or replaced too.

For manufacturing and technological reasons the design and the layout of the flat conductors and connector circuits in the central electric unit is fixed as regards its power distributing function. If it is required to adjust or match the electric central unit to different requirements, this can be done in most cases through relatively large additional expenditures. To change the outlay or configuration of the flat conductors, for example, cost intensive changes in processing tools are necessary and particularly in the case of small series such changes in most cases are prohibitive from economic point of view.

SUMMARY OF THE INVENTION

It is, therefore a general object of this invention to overcome the disadvantages of the prior art central electric units of this kind.

In particular, it is an object of this invention to provide a central electric unit in which the electric interconnection of flat conductors on respective conductor boards can be easily and selectively changed in accordance with different design requirements.

Another object of this invention is to enable such circuit changes by simple means which are cost effective even in individual modifications.

In keeping with these objects and others which will become apparent hereafter, one feature of this invention resides, in the provision of a pack of superposed conductor plates each including flat conductors supported on an insulating board, the packs having a bottom side, a top side and lateral sides; a plurality of connector sockets arranged on said top side to receive connector plugs of the electric components; means for electrically connecting said connector sockets to assigned flat conductors on different intermediate insulating boards in the pack; a plurality of connector pins arranged on the different intermediate insulating boards and projecting from at least one of said lateral sides, said connector pins being electrically connected to assigned flat conductors on corresponding intermediate insulating boards; a bridging conductor plate arranged parallel to said at least one lateral side opposite said projecting connector pins and including bridging conductors for selectively interconnecting said connector pins in such a manner as to provide a desired interconnection of said connector socket.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

The central electric unit 1 shown in the Figures is designed for the installation in a motor vehicle and serves for the interconnection of controlling and current conducting circuits for a large number of consuming circuits of the motor vehicle, such as lamps, window wipers, blinkers, rear window heaters, passenger compartment heaters, mirror heaters, magnetic valves and the like. The central electric unit interconnects the various consuming circuits by means of plug and socket connectors.

Figure 2:
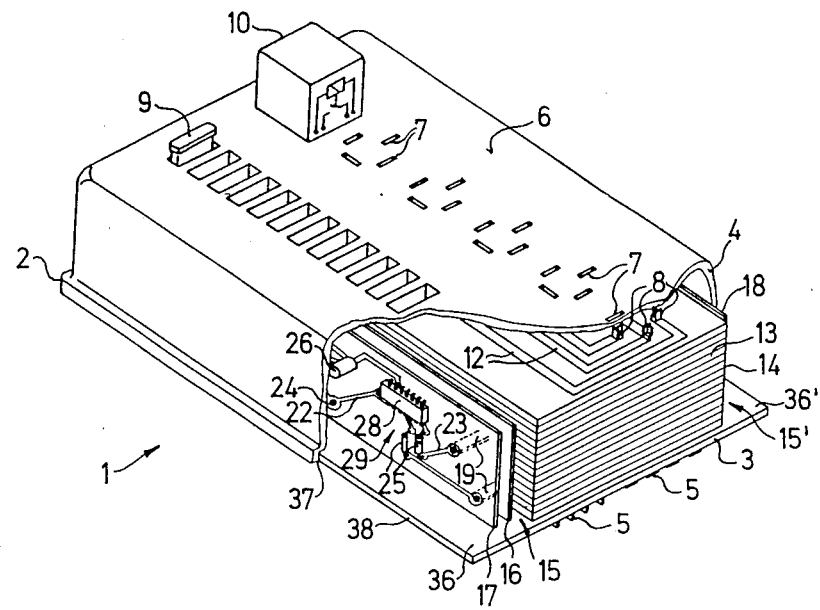
FIG. 2 is a perspective view, partly in section of the unit of FIG. 1 enclosed in a modified version of the insulating housing.

The central electric unit 1 includes a housing 2 of an electrically insulating synthetic material. In the embodiment of FIG. 2, the housing consists of a bottom plate 3 sealingly supporting a hood 4. The bottom plate 3 supports downwardly projecting connector plugs 5 insertable into terminal sockets of conductive strands and wiring harnesses in the motor vehicle. The top side 6 of the hood of the housing 2 is formed with a plurality of slots 7 under which connector sockets 8 are located. The top side 6 supports individual electrical component parts such as safety fuses 9 or switching apparatuses 10 containing relays. These component parts are provided with connector plugs insertable through the slots 7 into assigned connector sockets 8.

The housing 2 encloses a pack 14 of superposed conductor plates each including a rectangular insulating board 13 for supporting flat conductors 12 made preferably by stamping from an electrically conductive metal sheet to withstand high currents of consumer circuits in a motor vehicle. As shown in FIG. 2, the connector sockets 8 are electrically connected to respective flat conductors 12 on the uppermost insulating board 13 and are electrically connected to intermediate flat conductors 12 at different levels of the pack by electrical connecting means, as it will be explained below.

Figure 1:
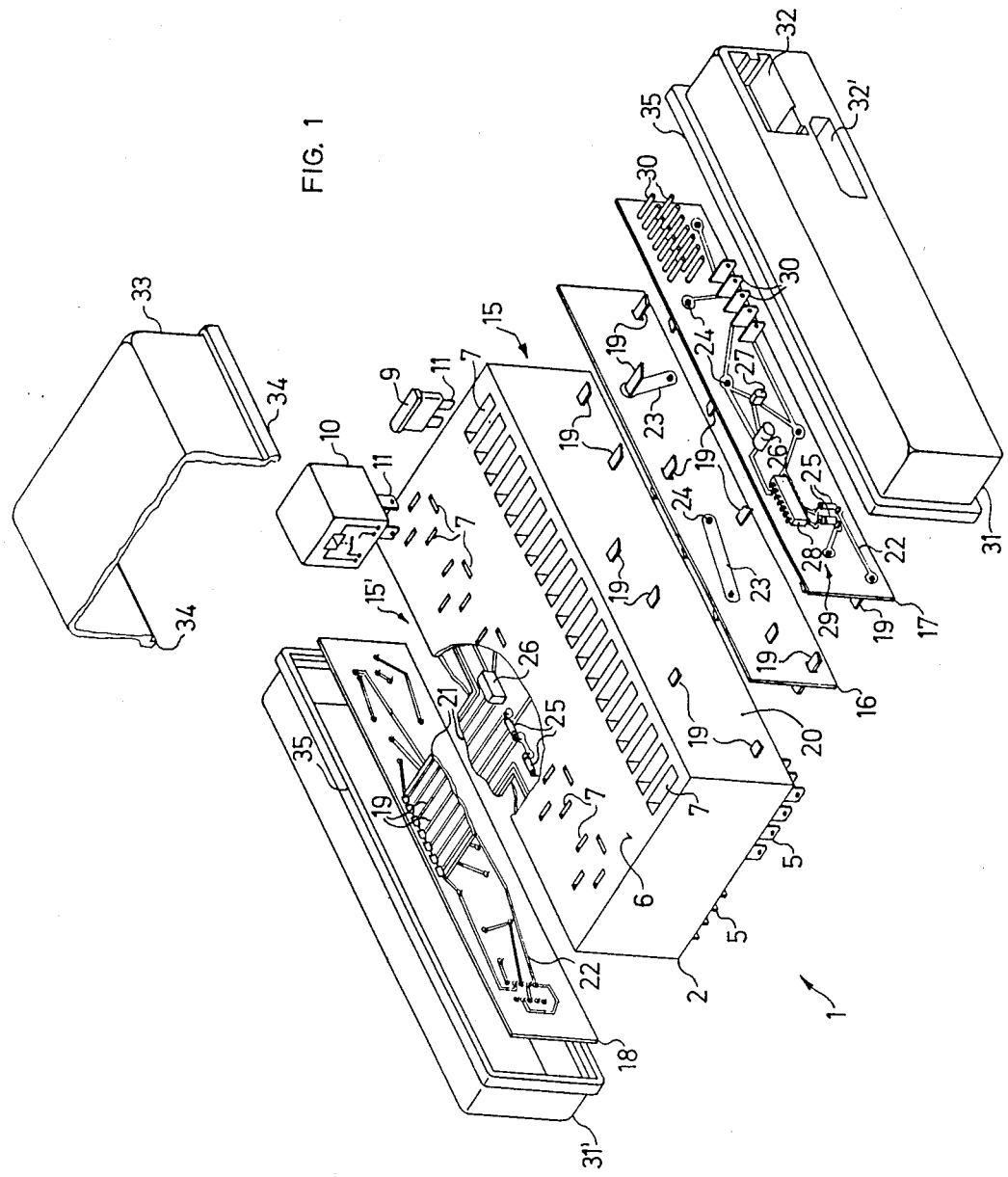
FIG. 1 is an exploded view of an embodiment of a central electric unit of this invention.

The pack 14 defines two opposite longitudinal lateral sides 15 and 15′. The lateral side 15 faces two printed circuit boards 16 and 17 spaced apart a small distance one from the other, the opposite lateral side 15′ faces a third printed circuit board 18. The printed boards 16, 17 and 18 extend parallel to the facing lateral sides 15 or 15′, thus forming right angles with the planes conductor plates 12, 13 in the pack 14. The flat conductors 12 supported on the intermediate insulating boards 13 are electrically connected to connector pins 19 projecting at different levels from lateral sides 15 and 15′ of the pack. In this embodiment, the connector pins 19 have a flat rectangular configuration to match the flat conductors 12. The projecting connector pin 19 can form an integral part of the assigned flat conductors 12 or can be made separately and connected to the assigned flat conductor 12 by riveting, for example. It will be seen from the Figures, the uppermost flat conductors 12 electrically connect connector sockets 8 to a set of uppermost connector pins 19 arranged side-by-side on a lateral extension 21 of the top insulating board 13. The connector pins 19 are electrically uppermost connected to the printed circuit board 18 by means of which the connector sockets are connected to the intermediate flat conductors 12 at different levels of the pack 14. For the sake of an unobstructed view of the board 18, the lateral extension 21 is shown divided in two cutaway parts. In reality, it forms a single integral part, as indicated by the lead lines. In the embodiment of FIG. 1, the connector pins 19 pass through lateral walls 20 of the housing 2 and the printed circuit boards 16 through 18 are arranged outside the housing. In the embodiment of FIG. 2, the connector pins 19 are immediately connected to the bridging printed circuit boards 16 through 18 and the whole assembly is enclosed in the housing 2.

In many applications it may be of advantage when the superposed conductor plates 12, 13 in the pack as well as the connector pins 19 can be made in the form of printed circuits produced by etching a metal foil on respective insulating boards 13. In any case, the laterally projecting connector pins 19 extend in the plane of the assigned flat conductors 12 toward the facing printed circuit boards 16, 17 or 18. The bridging conductors 22 on circuit boards 17 and 18 or bridging conductors 23 on circuit board 16 can be connected to selected connector pins 19 by soldering. Instead of soldering, it may be of advantage to make electrical contact between the pins 19 and the bridging conductors 23 by means of plug and socket connections using resilient contacting plugs or bushings. As mentioned before, the laterally projecting connector pins 19 can be selectively interconnected by the bridging conductors 23 arranged or formed on the facing conductor plates 16 through 18. Due to possibility of the selective connection of the bridging conductors 23 to the tips of connector pins 19 the advantage is achieved that expensive changes in manufacturing tools for producing different configurations of the flat conductors 12 are no longer necessary. The bridging conductors 23 permit an individual matching of the internal connection of the entire central electric unit 1 to different connections of consumer circuits. By a simple rearrangement of the bridging conductors the manufacturer can adjust the unit to all modifications of the electric circuitry in a motor vehicle.

It will be seen from FIG. 1, some of the projecting connector pins 19 at the lateral side 15 pass through the first circuit board 16 to contact printed conductors 22 on the second circuit board 17. Preferably, the tips of the flat connector pins 19 have pointed tips which at points 24 are connected to the printed conductors 22 or to the bridging conductors 23 by soldering. The connector pins 19 passing through the first circuit plate 16, if desired, can be also connected at points 24 to the printed conductors 23 or the second circuit board 17.

It will be also seen from the Figures that the lateral second circuit board or connector plate 17 facing the conductor pins 19 supports additional electronic component parts, such as, for example, resistors 25, capacitors 26, transistors 27, microprocessor 28 and the like. It is of particular advantage when the printed conductors 22 together with the additional electrical components on the board 17 are interconnected into a functional unit, preferably into an electronic controlling device for controlling, monitoring and regulating electric consumer circuits of the motor vehicle. In contrast to prior art embodiments where such electronic devices were incorporated in the disconnectable switching apparatuses or modules, this invention separates such electronic control circuits from the detachable switching apparatuses 10 and permanently provides such electronic control on the lateral printed circuit boards 16 through 18 which by means of the projecting connector pins 19 and the flat conductors 12 are connected to corresponding electrical consuming circuits. Plugs 11 of the separate switching apparatuses 10 are inserted into corresponding connector sockets 8. This arrangement has the important advantage that the printed circuit boards 16 through 18 in the form of controlling devices for the electric consumers can be manufactured at substantially lower cost. At the same time, the exchangeable switching apparatuses 10 also become simpler in design and less expensive to manufacture inasmuch as only series production of a constant design, for example, switching relays only, are involved. Accordingly, if due to some malfunction the switching apparatus 10 is to be replaced, the electronic control circuit remains in the central electric unit 1 and only the relays are exchanged.

Still another advantage of the central electric unit 1 of this invention is obtained when the functions of different electronic controlling devices on the lateral printed circuit board 16 through 18 are integrated in a microcomputer 29. The microcomputer 29 includes a microprocessor 28, a program memory and at least an input and output unit leading to the corresponding peripheral devices or electronic components. In this modification a particularly cost effective integration of different controlling functions for actuating different electrical consuming circuits of the motor vehicle is achieved. The microcomputer 29 of course is functionally independent of the relays of the switching apparatus 10 and concentrates a great variety of switching and controlling functions in a minimum space. A further advantage of the computerized central electric unit 1, apart from the reduced number of requisite component parts and increased accuracy and operational reliability is the fact that only a single safety device against voltage peaks, transients and negative pulses in the electrical network is required.

The second printed circuit board or conductor plate 17 supports also an array of additional connector pins 30 of cylindrical configuration which project laterally from the unit 1 to receive a multiple connector socket of a wiring harness in the motor vehicle.

In the embodiment of FIG. 1, there are provided two lateral caps 31, 31' enclosing the printed circuit boards 16 through 18 and sealingly engaging the rims of the lateral walls 20 of the housing 2. The lateral cap 31 is formed with two recesses 32, 32' surrounding the arrays of lateral connector pins 30 and 30'. The recesses 32 and 32' have a configuration suitable for accommodating different multiple connector sockets of the wiring harnesses. The top side 6 of housing 2 is covered by cap 33 enclosing the safety fuses 9 and the switching apparatuses 10. The cap 33 has a peripheral rim 34 for snap engaging the peripheral flange 35 on the lateral caps 31, 31'. In this manner, in assembled condition the housing parts provide a sealing enclosure of all electrical components of the unit 1. It will be noted, however, that the top cap 33 in most applications can be dispensed with because the housing 2 and the lateral caps 31, 31' reliably protect all electronic components against the effects of environment.

In the modification of FIG. 2, the bottom plate 3 of the housing is slightly increased in width so that lateral portions 36, 36' extend beyond the lateral printed circuit boards 16 through 18. The covering hood 4 of the housing is provided with a stepped rim 37 which snap engages the periphery of the bottom plate 3 and separate lateral housing parts can be dispensed with.

It will be also noted that the switching apparatuses 10 can include electronic relays including semiconductors instead of electromagnetically operating relays. The electronic relays can be in the form of switching power transistors dimensioned for switching over currents of high intensity. The electronic switches enable a further simplification of the corresponding controlling devices, lower manufacturing cost and improved service life and reliability.

While the invention has been illustrated and described as embodied in specific examples of a central electric unit for motor vehicles, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A device for centralized inteconnection of electric components of a motor vehicle, such as safety fuses, plug-in connectors, wiring harnesses, switching apparatuses for electric consuming circuits and electronic control devices for the electric consuming circuits, comprising a pack of vertically superposed flat conductors separated from each other in horizontal and vertical directions by insulating means, said flat conductors being made of sheet metal to withstand high currents flowing through the electric consuming circuits, and the insulating means delimiting opposite lateral sides of the pack; a plurality of connector sockets arranged above the uppermost flat conductors to receive the plug-in connectors; at least a part of the uppermost flat conductors being connected to said connector sockets; a plurality of connector pins projecting from at least one lateral side of said pack at different levels of said flat conductors, the connector pins at the uppermost level being connected to said part of the uppermost flat conductors and the remaining connector pins to assigned intermediate flat conductors; a first conductor plate supporting components of at least one electronic control device for a consuming circuit of the motor vehicle, said first conductor plate being fixedly arranged at said one lateral side opposite said projecting connector pins and further supporting bridging conductors for interconnecting selected connector pins at the uppermost and intermediate levels to provide a desired interconnection of said connection sockets; and at least one separate switching apparatus having a plug-in connector detachably inserted in assigned ones of said connector sockets to switch a consuming circuit in the motor vehicle.

2. A device as defined in claim 1, further comprising additional conductor plates arranged parallel to said lateral sides of the pack.

3. A device as defined in claim 2, wherein an additional bridging conductor plate facing the other lateral side of said pack has bridging conductors connected with connector pins projecting from said other lateral side.

4. A device as defined in claim 3, wherein at least one of said projecting connector pins passes through said first conductor plate and electrically contacts bridging conductors on the additional conductor plates arranged parallel to said first conductor plate.

5. A device as defined in claim 4, wherein said at least one connector pin which passes through said conductor plates is formed with a pointed tip connected to a bridging conductor on one of said additional conductor plates.

6. A device as defined in claim 4, wherein said additional conductor plates are in the form of printed circuit boards interconnecting various component parts such as resistors, capacitors, transisitors, microprocessors forming electronic control devices for different consumer circuits of the motor vehicle.

7. A device as defined in claim 6, wherein said control devices are functionally integrated in a microcomputer formed on at least one of said additional conductor plates and including a microprocessor, a program memory, an input and an output unit connected to peripheral devices.

8. A device as defined in claim 7, wherein an additional conductor plate supports laterally projecting additional connector pins connected to said control devices and being connectable to a multiple connector socket of a wiring harness of a motor vehicle.

9. A device as defined in claim 2, wherein said connector pins project from opposite lateral sides of the pack and being electrically connected to conductors on a facing additional conductor plate and the first conductor plate so as to connect said connector sockets to the assigned flat conductors on the different levels in the pack.

10. A device as defined in claim 9, wherein said insulating means includes superposed insulating boards, at least the uppermost insulating board is formed with a lateral extension for supporting uppermost connector pins connected to assigned connector sockets, the uppermost connector pins contacting bridging conductors on an additional conductor plate facing said other lateral side.

11. A device as defined in claim 2, further comprising a housing enclosing said pack of superposed flat conductors, said projecting connector pins passing through opposite lateral walls of the housing, said first conductor plate and said additional conductor plates being arranged opposite said connector pins outside said housing, and further including lateral caps covering said additional conductor plates and sealingly engaging the lateral sides of the housing.

12. A device as defined in claim 2 wherein said pack and said conductor plates are supported on a bottom plate and covered by a top hood sealingly engaging said bottom plate.

13. A device as defined in claim 11, wherein said lateral caps are provided with peripheral rims for sealingly engaging the periphery of the lateral sides of said housing.

14. A device as defined in claim 13, wherein at least one of said lateral caps is formed with recesses for accommodating an array of additional connector pins connectable to a multiple connector socket of a wiring harness.

15. A device as defined in claim 13, wherein said housing has a top side formed with slots located opposite respective connector sockets, and further comprising a covering cap formed with a peripheral rim for sealingly engaging said lateral caps.

16. A device as defined in claim 1 wherein said switching apparatus insertable into said connector sockets includes an electronic relay in the form of a switching transistor.

* * * * *